(12) United States Patent
Chen et al.

(10) Patent No.: US 11,164,854 B2
(45) Date of Patent: Nov. 2, 2021

(54) DISPLAY MODULE AND ELECTRONIC DEVICE THEREOF

(71) Applicant: Chiun Mai Communication Systems, Inc., New Taipei (TW)

(72) Inventors: Chi-An Chen, New Taipei (TW); Ming-Ta Hsieh, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 10 days.

(21) Appl. No.: 16/441,710

(22) Filed: Jun. 14, 2019

(65) Prior Publication Data

US 2019/0385990 A1 Dec. 19, 2019

(30) Foreign Application Priority Data

Jun. 15, 2018 (CN) .......................... 201810623596.9

(51) Int. Cl.
| | |
|---|---|
| *H01L 27/15* | (2006.01) |
| *H01L 25/16* | (2006.01) |
| *G06F 1/16* | (2006.01) |
| *G02B 27/01* | (2006.01) |
| *G02C 11/00* | (2006.01) |
| *H02S 40/20* | (2014.01) |

(52) U.S. Cl.
CPC ........ *H01L 25/167* (2013.01); *G02B 27/0172* (2013.01); *G02C 11/10* (2013.01); *G06F 1/163* (2013.01); *H02S 40/20* (2014.12); *G02B 2027/0178* (2013.01)

(58) Field of Classification Search
None
See application file for complete search history.

(56) References Cited

U.S. PATENT DOCUMENTS

| | | | |
|---|---|---|---|
| 9,484,332 B2 * | 11/2016 | Natarajan | ............... H01L 31/18 |
| 2010/0055824 A1 * | 3/2010 | Lin | .......................... B82Y 10/00 |
| | | | 438/73 |
| 2016/0276326 A1 | 9/2016 | Natarajan et al. | |

FOREIGN PATENT DOCUMENTS

| | | |
|---|---|---|
| CN | 103593051 A | 2/2014 |
| CN | 107644887 A | 1/2018 |
| TW | I582944 B | 10/2016 |

* cited by examiner

*Primary Examiner* — Hung K Vu
(74) *Attorney, Agent, or Firm* — ScienBiziP, P.C.

(57) ABSTRACT

A pair of smart glasses including a headset, a frame, and an optical photoelectric conversion unit that can gather and utilize solar energy to supplement the electrical energy of a built-in battery. The smart glasses also include a display module comprising a plurality of display units arranged in a matrix. Each display unit comprises at least one micro LED unit and at least one first optical photoelectric conversion unit. A number of the micro LED units functions as a display, and also being controllable as an infrared light source for retinal scanning of the user.

20 Claims, 6 Drawing Sheets

DISPLAY MODULE AND ELECTRONIC DEVICE THEREOF

FIELD

The subject matter herein generally relates to display module on headset.

BACKGROUND

Smart glasses may include a headset and a frame. The frame includes a plurality of electronic elements, such as a camera, a display module, a processor, a BLUETOOTH module, and so on. The electronic elements are powered by a battery which must be of small size even though power consumption by the electronic elements is typically high.

Thus, there is room for improvement in the art.

BRIEF DESCRIPTION OF THE FIGURES

Implementations of the present disclosure will now be described, by way of example only, with reference to the attached figures.

DETAILED DESCRIPTION

Figure 1:
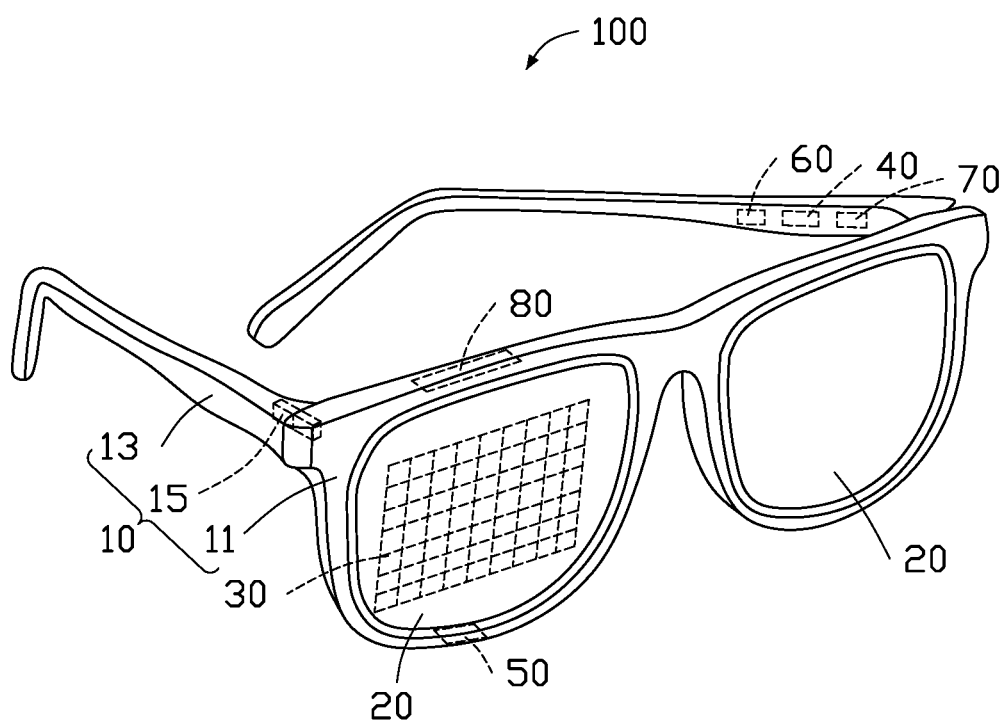
FIG. 1 is a diagram illustrating an embodiment of a pair of smart glasses, the smart glasses include display modules, and each display module includes display units.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

The present disclosure provides smart glasses which are able to utilize solar energy.

FIG. 1 shows a pair of smart glasses 100. The smart glasses 100 include a frame structure 10, two lenses 20 fixed on the frame 10, a display module 30, a processor 40, a battery 50, a battery control module 60, and a filter control module 70.

In one embodiment, the frame structure 10 includes a frame 11, two arms 13, and two connection portions 15. The lenses 20 are fixed in the frame 11. The arms 13 are rotatably connected to the frame 11 through the connection portions 15. In one embodiment, the connection portions 15 may be sprung hinges.

Figure 3:
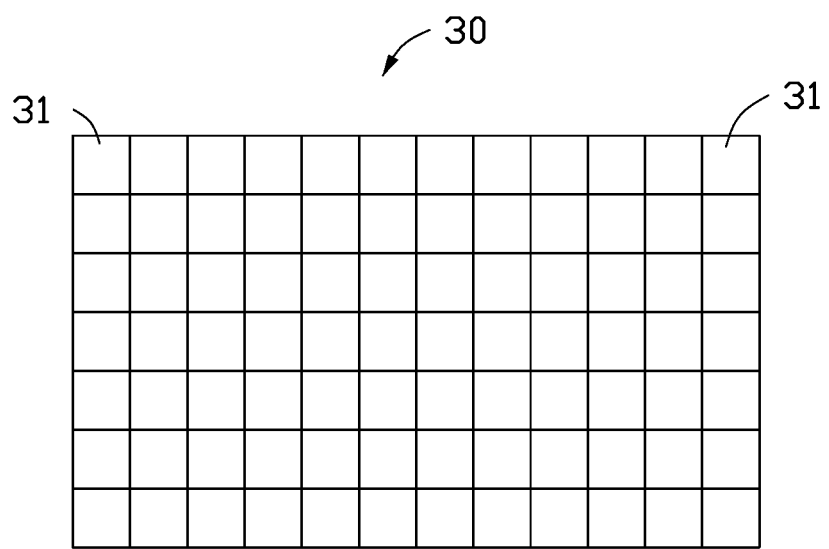
FIG. 3 is a diagram illustrating the display modules of FIG. 1.

FIG. 3 shows the display module 30 in a planar view. The display module 30 is disposed in at least one of the lenses 20. The display module 30 includes a plurality of display units 31 arranged in a matrix.

Figure 4:
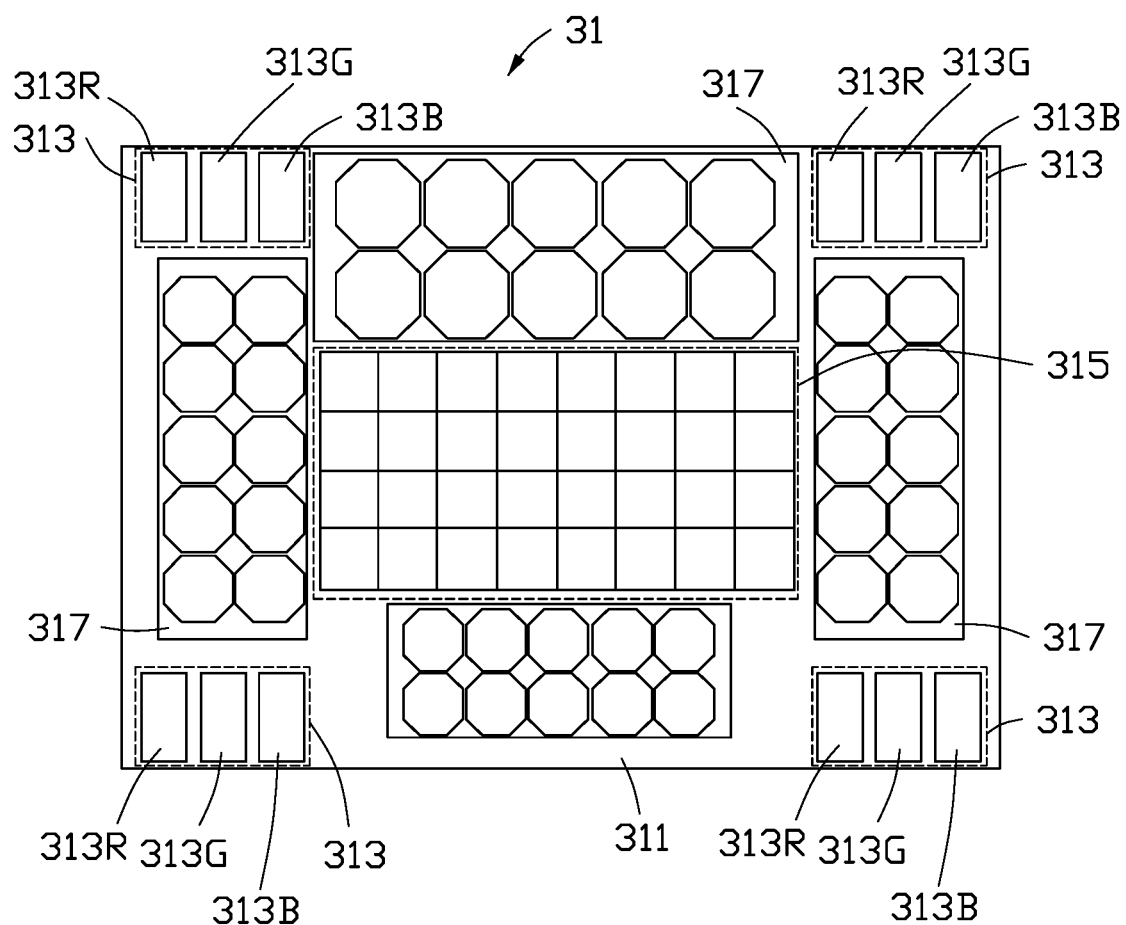
FIG. 4 is a planar view illustrating a first embodiment of the display units of FIG. 3.
Figure 5:
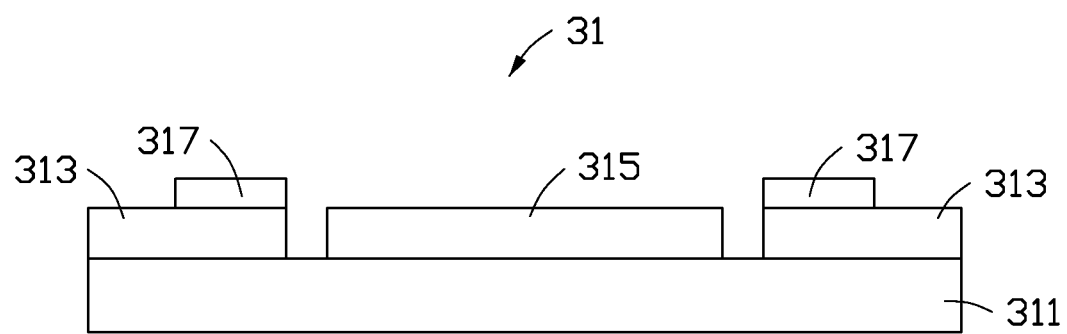
FIG. 5 is a planar side view of the display units of FIG. 4.

FIG. 4 shows the display units 31 in a planar view. FIG. 5 shows side view of the display units 31. Each display unit 31 includes a substrate 311, at least one micro light emitting diode (LED) unit 313, an optical sensor 315, and at least one first optical photoelectric conversion unit 317.

In one embodiment, the substrate 311 is a printed structure on which a semiconductor element can be formed. The substrate 311 is made of transparent material or translucent material. In other embodiments, the substrate 311 can be made of materials such as plastic, glass, transparent metal, or sapphire.

Micro LED units 313 are disposed on the substrate 311. In one embodiment, each display unit 31 includes four micro LED units 313. The four micro LED units 313 are disposed on edges of the substrate 311. Specifically, the four micro LED units 313 are disposed on four corners of the substrate 311. In other embodiments, the number of micro LED units 313 in each display unit 31 may be adjusted for different requirements, and is not limited hereto.

Each micro LED unit 313 includes at least three LEDs. In one embodiment, there are three adjacent LEDs in each micro LED unit 313. In other embodiments, the number of the LEDs may vary for different requirements.

In one embodiment, the at least three LEDs are arranged in a line, in a rhombus shape, or in a diamond shape. Each LED has substantially a rectangular shape emitting light straight out. In one embodiment, each micro LED unit 313 emits light of three primary colors. Each micro LED in one micro LED unit 313 emits a different color. The micro LED unit 313 includes at least one micro LED 313R for emitting red light, at least one micro LED 313G for emitting green light, and at least one micro LED 313B for emitting blue light.

The micro LED unit 313 emits light based on the light of the three primary colors emitted by the micro LEDs, the color of the mixed primary light from different micro LED unit 313 is white. Thus, the display module 31 is able to provide display functionality based on the visible light of the micro LED units 313. The micro LED unit 313 of the display module 31 is also able to emit non-visible light, such as infrared light. The display module 31 can function as an infrared light source, and the infrared light is emitted into a retina of a human eye, thus the micro LED unit 313 of the display module 31 is able to provide retinal scanning functionality. In one embodiment, the light emitted by the micro LED unit 313 includes about 90% non-visible light and about 5%-10% visible light.

Figure 6:
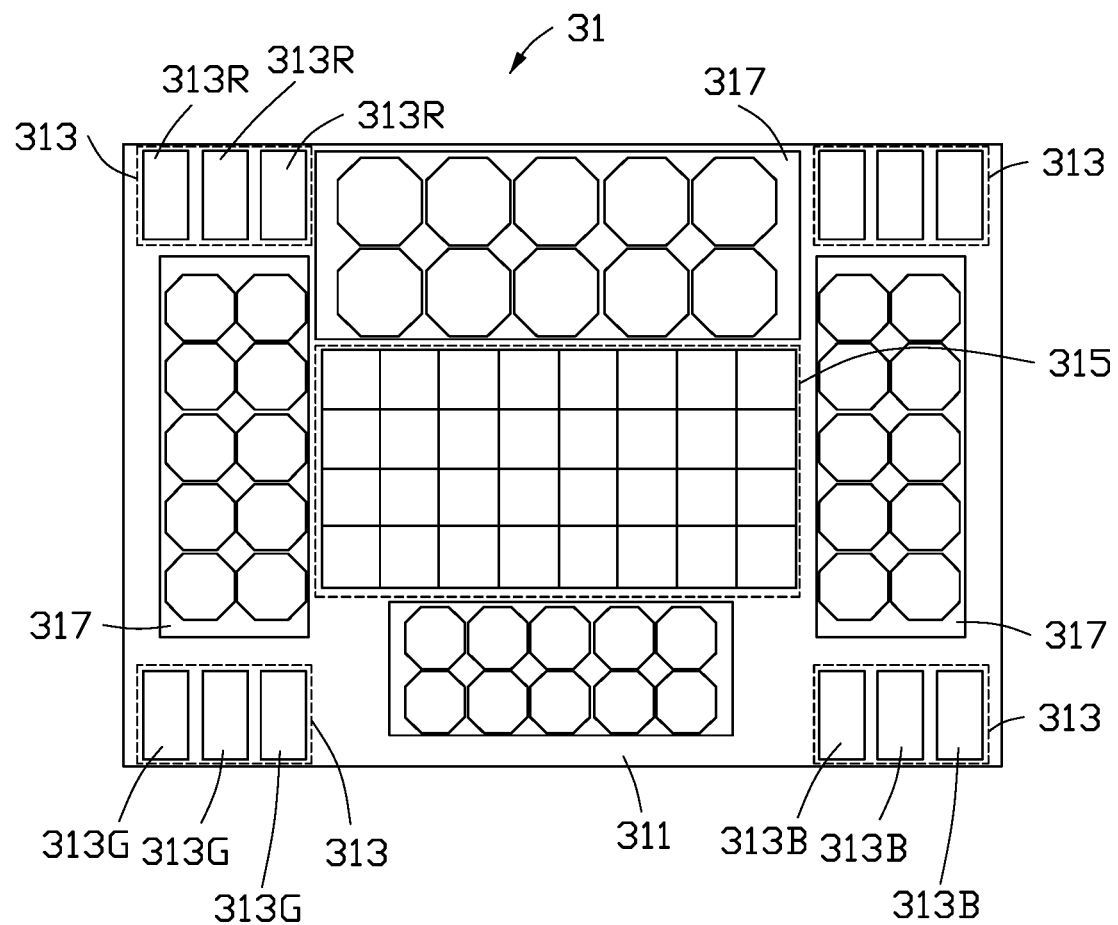
FIG. 6 is a planar view illustrating a second embodiment of the display units of FIG. 3.

FIG. 6 shows a second embodiment of the micro LED unit 313. The micro LED unit 313 includes at least three LEDs. In one embodiment, there are three adjacent LEDs in each micro LED unit 313. In other embodiments, the number of the LEDs in each micro LED unit 313 can be adjusted for different requirements, not being limited.

In one embodiment, the at least three LEDs are arranged in a line, or are arranged in a rhombus shape, or are arranged in a diamond shape. Each LED is substantially rectangular, and emits light straight out from the center. In one embodiment, the LEDs in each micro LED unit 313 emit light of one color. The micro LED unit 313 in the upper left corner includes three LEDs 313R emitting red primary light. The micro LED unit 313 in the lower left corner includes three LEDs 313G emitting green primary light. The micro LED unit 313 in the lower right corner includes three LEDs 313B emitting blue primary light.

Each micro LED unit 313 emits one color of primary light. The micro LED units 313 can respectively emit light of three primary colors and such light can be mixed to form white light. Thus, the display module 31 is able to provide display functionality based on the visible light of the micro LED unit 313. The micro LED unit 313 of the display module 31 is also able to emit non-visible light such as infrared. The display module 31 can be an infrared light source, and the infrared light is emitted into a retina of a human eye, thus the micro LED unit 313 of the display module 31 is able to provide retinal scanning functionality. In one embodiment, the light emitted by the micro LED unit 313 includes about 90% non-visible light and about 5%-10% visible light.

The optical sensor 315 is located in a middle portion of the substrate 311, and is electrically connected to the processor 40 and the battery 50. In one embodiment, the optical sensor 315 is an infrared image sensor. When the micro LED unit 313 emits infrared light, the optical sensor 315 receives the infrared light reflected by at least a human eyeball, thus positions and movements of the human eyeball can be recognized. In one embodiment, movements of the human eyeball include saccade, fixations, smooth movement, and blinks, but are not limited hereto.

The at least one first optical photoelectric conversion unit 317 converts solar energy into electrical power. In one embodiment, the at least one first optical photoelectric conversion unit 317 is a solar cell. The at least one first optical photoelectric conversion unit 317 is disposed on a region of the substrate which does not carry the micro LED 313 and the optical sensor 315. In one embodiment, each display module 31 includes four first optical photoelectric conversion units 317. Each first optical photoelectric conversion unit 317 is located between adjacent micro LED units 313, and surrounds the optical sensor 315.

In one embodiment, in each display module 31, an area of one micro LED units 313 is less than 20% of a total area of the substrate 311. An area of the optical sensors 315 is equal to 30% of the total area of the substrate 311, and an area of the first optical photoelectric conversion units 317 is equal to 50% of the total area of the substrate 311.

In one embodiment, the display module 31 is transparent. Thus, the lenses 20 remain transparent when the display module 31 is fixed on the lenses 20, and vision of the wearer is not affected by the display module 31.

Figure 2:
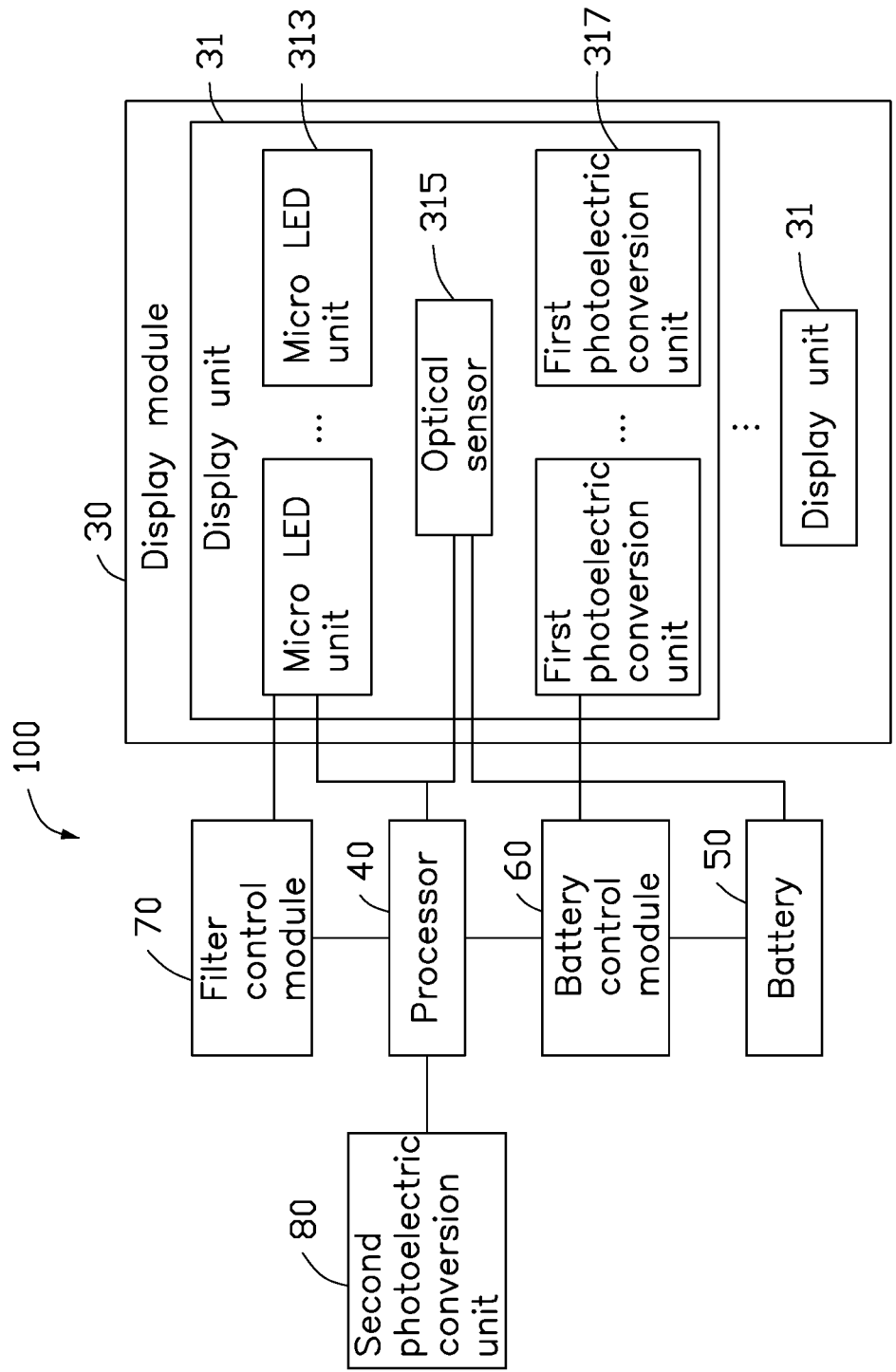
FIG. 2 is a diagram illustrating another embodiment of the smart glasses of FIG. 1.

Referring to FIGS. 1 and 2, the processor 40 is disposed in the arms 13 of the frame structure 10. The processor 40 is electrically connected to the micro LED unit 313, the optical sensor 315, and the battery controlling module 60 for controlling operations of the display module 30, the battery controlling module 60, and the filter control module 70. In one embodiment, the processor 40 receives data from the optical sensor 315, and determines positions and movements of the human eyeball. The processor 40 can be controlled by user and can issue instructions based on positions and movements of the human eyeball. For example, the display module 30 may display at least one home directory and a plurality of sub-directories below the home directory. When the human eyeball viewing a specified region is determined to be fixed, the processor 40 generates an instruction such as selection. When a blinking action of the human eyeball is determined, the processor 40 generates an instruction such as returning to a previous directory from current sub-directory. When an eye movement followed by fixation is determined, the processor 40 generates an instruction such as selection based on the final position of the eye.

In one embodiment, the battery 50 is a polymer colloidal battery or a graphite thin material battery. The battery 50 is disposed at bottom of the frame 11 of the frame structure 10. Specifically, the battery 50 provides power supply to the modules of the smart glasses 100.

The battery control module 60 is disposed in the arms 13 of the frame structure 10. The battery control module 60 is electrically connected to the at least one first optical photoelectric conversion unit 317 and the battery 50. The battery control module 60 stores electrical power from the at least one first optical photoelectric conversion unit 317 in the battery 50.

The filter control module 70 is disposed in the arms 13 of the frame structure 10. The filter control module 70 is electrically connected to the processor 40 and the at least one micro LED unit 313. The filter control module 70 controls the micro LED module 313 to emit non-visible light such as infrared under the control of the processor 40. Thus, the display module 31 is able to provide retinal scanning functionality.

In one embodiment, the processor 40 controls the micro LED units 313 of one of the display units 31 to display images, and controls the micro LED units 313 of an adjacent display unit 31 to emit infrared light through the filter control module 70. The optical sensor 315 uses the infrared light to execute the retinal scanning function.

In one embodiment, the processor 40 controls some of the micro LED units 313 in each display module 31 to display images, and controls the rest of the micro LED units 313 in each display module 31 to emit the infrared light through the filter control module 70. The optical sensor 315 uses the infrared light to execute the retinal scanning function.

In one embodiment, the processor 40 controls each micro LED unit 313 in each display module 31 to display images for a specified time duration, such as 1 millisecond, and then each micro LED unit 313 in each display module 31 emits the infrared light for a period of time. As such, the optical sensor 315 uses the infrared light to execute the retinal scanning function.

In one embodiment, the smart glasses 100 further include at least one second optical photoelectric conversion unit 80. The at least one second optical photoelectric conversion unit 80 is electrically connected to the processor 40, and converts the solar energy into electrical power. In one embodiment, the at least one second optical photoelectric conversion unit 80 is a solar cell. The at least one second optical photoelectric conversion unit 80 is disposed in the frame 11 of the frame structure 10, and can provide power to the modules of the smart glasses 100.

In other embodiments, the display module 30 can be arranged in other electronic devices with display screen, such as the electronic device with lens or glasses. The electronic device can be a mobile phone or a personal digital assistant. While the display module 30 is arranged in the electronic device with the lens or glasses, the display module 30 is disposed in the lens or glasses. In other embodiments, the display module 30 is arranged in a head up display visible on a windscreen in a car.

The at least one first optical photoelectric conversion unit 317 is disposed in each display unit 31 of the smart glasses 100 for converting solar energy into the electrical power, and provides the electrical power to the battery 50 for storing. Thus, the smart glasses 100 convert solar energy into electrical power which is stored in the battery 50, and the need for a larger size of battery is reduced, and the service life of the battery 50 in the smart glasses 100 is improved.

While various and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A display module comprising:
    a plurality of display units arranged in a matrix; each display unit comprising at least one micro LED unit and at least one first optical photoelectric conversion unit; the at least one first optical photoelectric conversion unit configured to convert solar energy into electrical power; each display unit further comprises an optical sensor; the optical sensor receives infrared light reflected by at least a human eyeball to perform retinal scanning function.

2. The display module of claim 1, wherein each display unit further comprises a substrate; the at least one micro LED unit is disposed on an edge of the substrate, and the optical sensor is disposed on a middle portion of the substrate.

3. The display module of claim 2, wherein the at least first optical photoelectric conversion unit is disposed on a region of the substrate without the at least one micro LED unit and the optical sensor.

4. The display module of claim 2, wherein each display unit comprises four micro LED units and four first optical photoelectric conversion units; the four micro LED units are respectively disposed on four corners of the substrate; each first optical photoelectric conversion unit is between two adjacent micro LED units, and the micro LED units surround the optical sensor.

5. The display module of claim 2, wherein an area of the at least one micro LED unit in each display unit is less than 20% of a total area of the substrate.

6. The display module of claim 1, wherein each display unit is transparent.

7. The display module of claim 1, wherein each micro LED unit comprises at least three micro LEDs; the at least three micro LEDs are arranged in a line and adjacent to each other.

8. The display module of claim 7, wherein the at least three micro LEDs in a same micro LED unit emit different color of primary light.

9. The display module of claim 7, wherein the at least three micro LEDs in a same micro LED unit emit one color of primary light.

10. The display module of claim 1, wherein each micro LED unit comprises at least three micro LEDs; the at least three micro LEDs are arranged in a rhombus shape and are adjacent to each other.

11. The display module of claim 1, wherein each micro LED unit comprises at least three micro LEDs; the at least three micro LEDs are arranged in a diamond shape and are adjacent to each other.

12. An electronic device comprising:
    a display module having a plurality of display units arranged in a matrix; each display unit comprising at least one micro LED unit and at least one first optical photoelectric conversion unit; the at least one first optical photoelectric conversion unit configured to convert solar energy into electrical power; each display unit further comprises an optical sensor; the optical sensor receives infrared light reflected by at least a human eyeball to perform retinal scanning function.

13. The electronic device of claim 12, wherein each display unit further comprises a substrate; the at least one micro LED unit is disposed on an edge of the substrate, and the optical sensor is disposed on a middle portion of the substrate.

14. The electronic device of claim 13, wherein the at least first optical photoelectric conversion unit is disposed on a region of the substrate without the at least one micro LED unit and the optical sensor.

15. The electronic device of claim 13, wherein each display unit comprises four micro LED units and four first optical photoelectric conversion units; the four micro LED units are respectively disposed on four corners of the substrate; each first optical photoelectric conversion unit is between two adjacent micro LED units, and the micro LED units surround the optical sensor.

16. The electronic device of claim 13, wherein an area of the at least one micro LED unit in each display unit is less than 20% of a total area of the substrate.

17. The electronic device of claim 12, wherein each display unit is transparent.

18. The electronic device of claim 12, wherein each micro LED unit comprises at least three micro LEDs; the at least three micro LEDs are adjacent to each other.

19. The electronic device of claim 18, wherein the at least three micro LEDs in a same micro LED unit emit different color of primary light.

20. The electronic device of claim 18, wherein the at least three micro LEDs in a same micro LED unit emit one color of primary light.

* * * * *